(12) United States Patent
Kang et al.

(10) Patent No.: US 12,738,755 B2
(45) Date of Patent: Sep. 15, 2026

(54) BATTERY CHARGING AND DISCHARGING SYSTEM INCLUDING PELTIER ELEMENT, AND TEMPERATURE CONTROL METHOD OF BATTERY CHARGING AND DISCHARGING USING THE SAME

(71) Applicant: LG ENERGY SOLUTION, LTD., Seoul (KR)

(72) Inventors: Dong Min Kang, Daejeon (KR); Kook Hee Jun, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 892 days.

(21) Appl. No.: 17/918,255

(22) PCT Filed: Dec. 15, 2021

(86) PCT No.: PCT/KR2021/019103
§ 371 (c)(1),
(2) Date: Oct. 11, 2022

(87) PCT Pub. No.: WO2022/149749
PCT Pub. Date: Jul. 14, 2022

(65) Prior Publication Data

US 2023/0133437 A1 May 4, 2023

(30) Foreign Application Priority Data

Jan. 8, 2021 (KR) ........................ 10-2021-0002613

(51) Int. Cl.
*H02J 7/70* (2026.01)
*H01M 10/44* (2006.01)
(Continued)

(52) U.S. Cl.
CPC ........... *H02J 7/751* (2026.01); *H01M 10/443* (2013.01); *H05K 7/20154* (2013.01);
(Continued)

(58) Field of Classification Search
CPC ...... H02J 7/0045; H02J 7/0052; H02J 7/0068; H01M 10/443; H01M 10/613;
(Continued)

(56) References Cited

U.S. PATENT DOCUMENTS

| | | | | |
|---|---|---|---|---|
| 6,225,788 B1 * | 5/2001 | Kouzu | ................ | H01M 10/613 320/150 |
| 6,512,347 B1 * | 1/2003 | Hellmann | ........... | H01M 10/625 429/120 |

(Continued)

FOREIGN PATENT DOCUMENTS

| | | |
|---|---|---|
| CN | 111630710 A | 9/2020 |
| JP | 7-65870 A | 3/1995 |

(Continued)

OTHER PUBLICATIONS

Extended European Search Report for European Application No. 21917911.6, dated Oct. 16, 2023.

(Continued)

*Primary Examiner* — Rexford N Barnie
(74) *Attorney, Agent, or Firm* — Birch, Stewart, Kolasch & Birch, LLP

(57) ABSTRACT

A secondary battery charging and discharging system includes an accommodation unit configured to accommodate a battery cell, a charging and discharging unit configured to be electrically connected to first and second electrode leads of the battery cell accommodated in the accommodation unit, and a cooler configured to supply cooled air to the battery cell accommodated in the accommodation unit. The cooler includes a blower fan, a heat sink, and a Peltier element positioned between the blower fan and the heat sink. A method of controlling an internal temperature of a secondary battery charging and discharging system is also provided.

13 Claims, 8 Drawing Sheets

(51) Int. Cl.
*H05K 7/20* (2006.01)
*H10N 10/13* (2023.01)

(52) U.S. Cl.
CPC ..... *H05K 7/20209* (2013.01); *H05K 7/20509* (2013.01); *H10N 10/13* (2023.02)

(58) Field of Classification Search
CPC ............... H01M 10/617; H01M 10/63; H01M 10/6563; H01M 10/6572; H01M 10/44; H01M 10/486; H05K 7/20154; H05K 7/20209; H05K 7/20172; H05K 7/20509
USPC ...... 429/26, 50, 62, 156; 320/107, 130, 104; 307/9.1, 10.1, 103, 104
See application file for complete search history.

(56) References Cited

U.S. PATENT DOCUMENTS

2007/0231678 A1* 10/2007 Park .................... H01M 10/647 429/62
2011/0287285 A1 11/2011 Yoon
2011/0300420 A1 12/2011 Johnson, Jr.
2012/0129020 A1 5/2012 Lachenmeier et al.
2013/0229153 A1* 9/2013 Sarkar ....................... B60L 3/04 320/137
2016/0082860 A1* 3/2016 Marchal ............. H01M 10/625 320/136
2016/0099489 A1 4/2016 Park et al.
2016/0141712 A1* 5/2016 Choi et al. ........ H01M 10/0481 320/150
2018/0366794 A1* 12/2018 Kim .................. H01M 10/6551
2020/0006741 A1* 1/2020 Shin ..................... H01M 50/211
2020/0076025 A1* 3/2020 Jo ....................... H01M 10/613
2020/0099034 A1* 3/2020 Jin ....................... H01R 25/162

FOREIGN PATENT DOCUMENTS

JP 11-15023 A 1/1999
JP 4849455 B2 1/2012
JP 5354846 B2 11/2013
JP 5738660 B2 6/2015
KR 10-2012-0032082 A 4/2012
KR 10-1163000 B1 7/2012
KR 10-2015-0034945 A 4/2015
KR 10-1725597 B1 4/2017
KR 10-2018-0122227 A 11/2018
KR 10-2019-0025336 A 3/2019
KR 10-2020-0034058 A 3/2020
KR 10-2089264 B1 3/2020
WO WO 2017/122690 A1 7/2017
WO WO-2020116825 A1 * 6/2020 .......... H01M 10/653

OTHER PUBLICATIONS

International Search Report (PCT/ISA/210) issued in PCT/KR2021/019103 mailed on Mar. 24, 2022.

* cited by examiner

【FIG. 1】
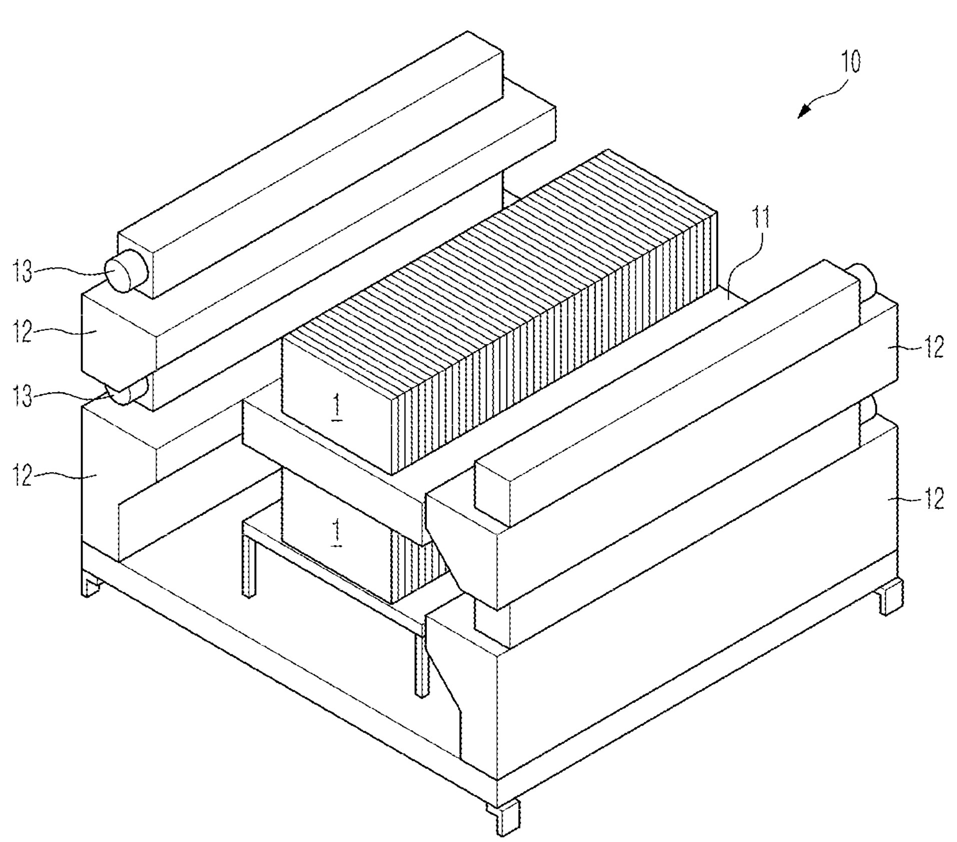
conventional art

【FIG. 2】
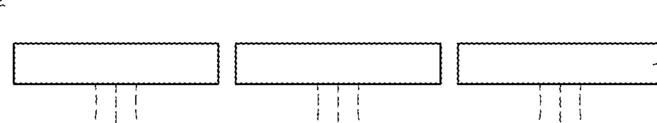
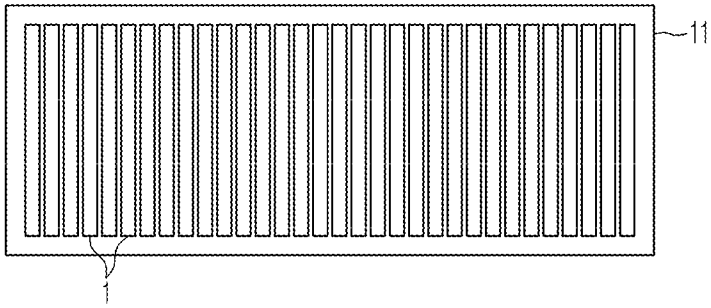
conventional art

【FIG. 3】
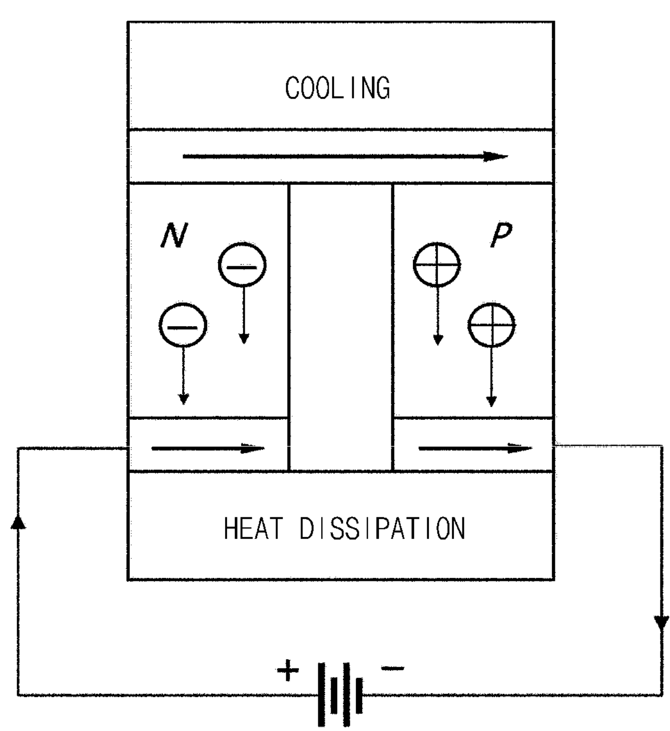

【FIG. 4】
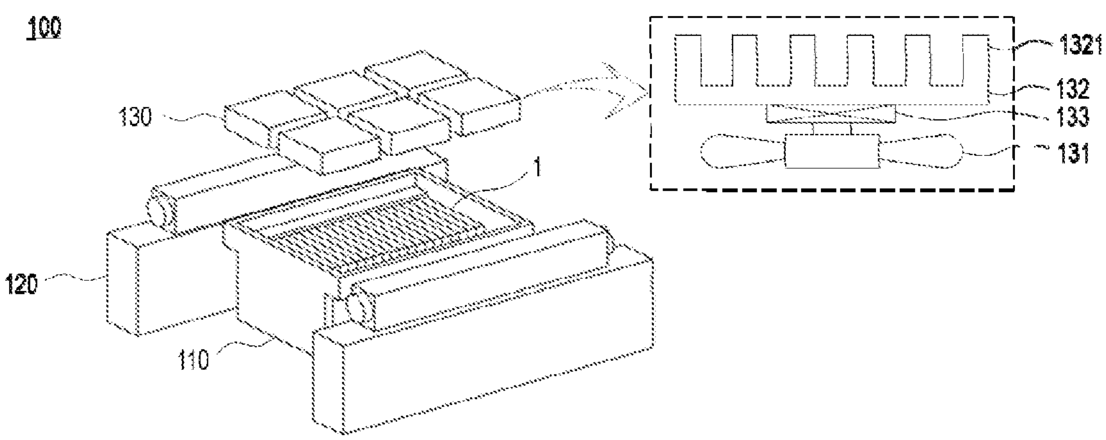

【FIG. 5】
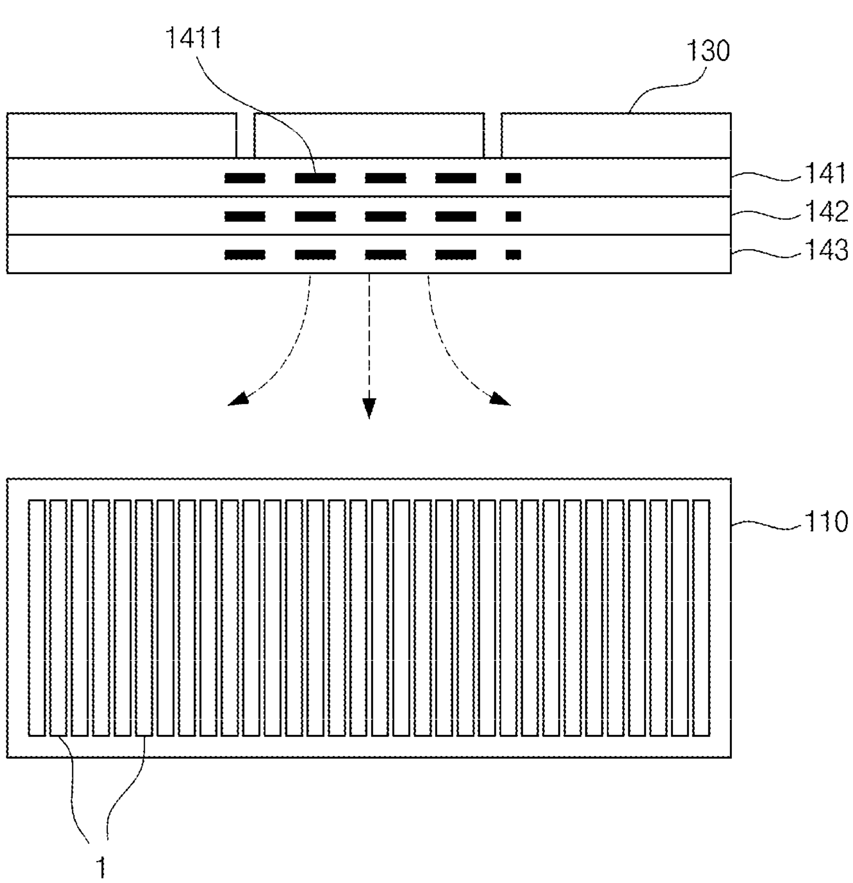

【FIG. 6】
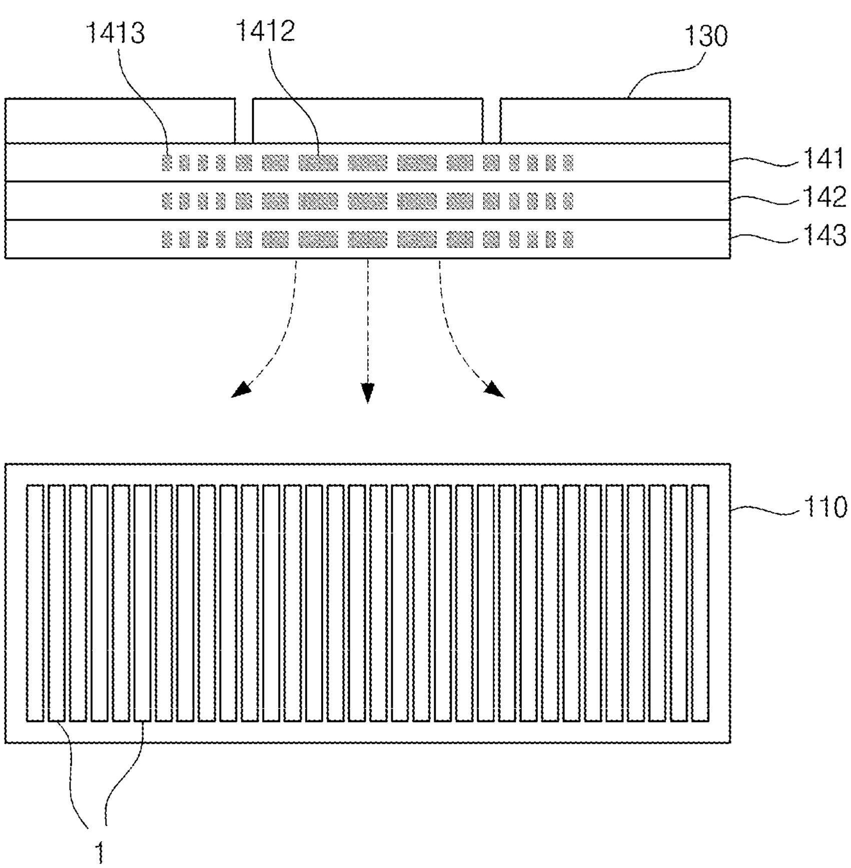

【FIG. 7】
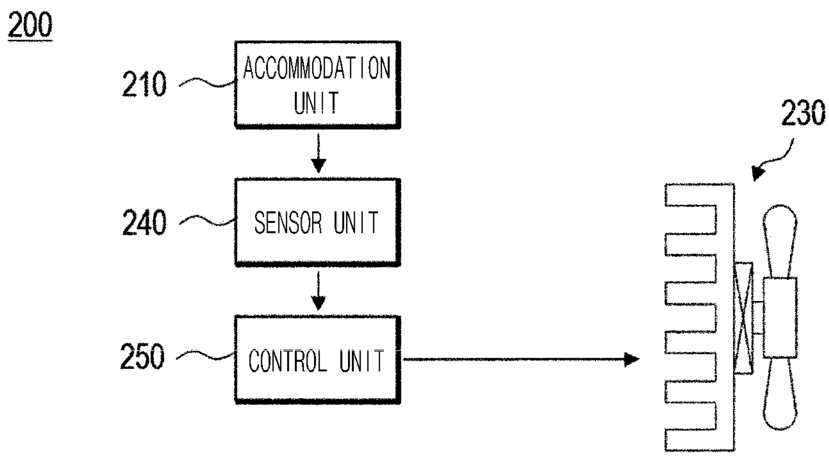

【FIG. 8】
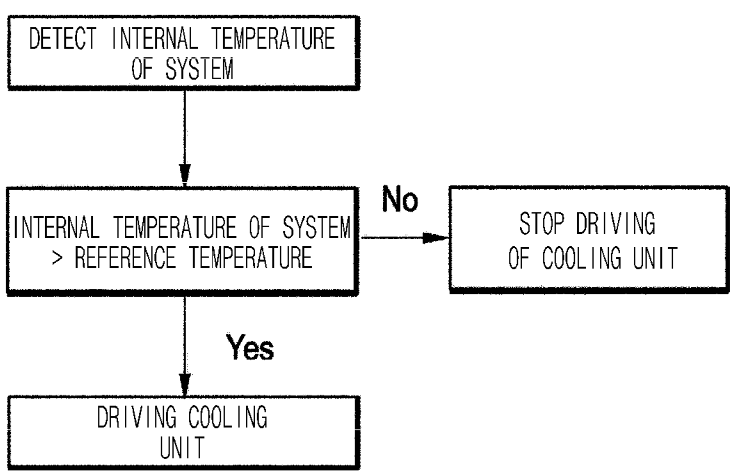

BATTERY CHARGING AND DISCHARGING SYSTEM INCLUDING PELTIER ELEMENT, AND TEMPERATURE CONTROL METHOD OF BATTERY CHARGING AND DISCHARGING USING THE SAME

TECHNICAL FIELD

This application claims the benefit of priority based on Korean Patent Application No. 10-2021-0002613, filed on Jan. 8, 2021, and the entire contents disclosed of the Korean patent application are incorporated herein as part of this specification.

The present invention relates to a secondary battery charging and discharging system including a Peltier element and a temperature control method of a secondary battery charging and discharging system using the same.

BACKGROUND ART

Recently, as technology development and demand for mobile devices increase, the demand for secondary batteries as an energy source is rapidly increasing.

Secondary batteries may be used in the form of a single battery cell or in the form of a battery module in which a plurality of unit cells are electrically connected, depending on the type of external device. For example, small devices such as mobile phones can operate for a predetermined time with the output and capacity of one battery cell whereas medium or large devices such as notebook computers, portable DVDs, small PCs, electric vehicles, and hybrid electric vehicles require the use of a battery module including multiple battery cells due to issues related to output and capacity.

Meanwhile, secondary batteries are manufactured through a process of assembling a battery cell and a process of activating a battery. In this case, typically, the battery activation process is performed by applying a required current to a battery cell to be charged or discharged by a charging and discharging device having positive and negative contact pins.

FIG. 1 is a diagram showing a conventional secondary battery charging and discharging system. As shown in FIG. 1, a conventional secondary battery charging and discharging system 10 is configured to include a tray 11 for accommodating multiple battery cells 1, a charging and discharging unit 12 having a structure that can be brought into electrical contact with a positive electrode and a negative electrode protruding from the battery cells 1 accommodated in the tray 11, and a cooling unit 13 provided to dissipate heat that is generated by the battery cells 1 while the battery cells 1 are repeatedly charged, discharged, and activated.

FIG. 2 is a diagram schematically showing a cooling unit in a conventional secondary battery charging and discharging system. As shown in FIG. 2, the cooling unit 13 of the conventional secondary battery charging and discharging system 10 is configured to include multiple blower fans 13' facing the tray 11 in which the multiple battery cells 1 are accommodated. However, the conventional cooling unit 13 is used for dissipating heat from the battery cells 1 accommodated in the tray 11 and therefore has limitations in effectively lowering the temperature inside the charging and discharging system.

Accordingly, there is a need to develop a technology for a secondary battery charging and discharging system that is capable of charging and discharging battery cells and also includes a cooling unit capable of efficiently dissipating heat generated in battery cells.

DISCLOSURE

Technical Problem

The present invention is for solving the above problems and is directed to providing a secondary battery charging and discharging system capable of increasing the cooling efficiency of a battery cell accommodated in an accommodation unit in a charging and discharging process for the battery cell, and a temperature control method of a secondary battery charging and discharging system using the same.

Technical Solution

The present invention provides a secondary battery charging and discharging system including a Peltier element. In one example, the secondary battery charging and discharging system according to the present invention includes an accommodation unit configured to accommodate a battery cell, a charging and discharging unit configured to be electrically connected to first and second electrode leads of the battery cell accommodated in the accommodation unit, and a cooler configured to supply cooled air to the battery cell accommodated in the accommodation unit. In this case, the cooler includes a blower fan, a heat sink, and a Peltier element positioned between the blower fan and the heat sink.

In a specific example, the Peltier element may have a structure including a heat-absorbing surface and a heat-dissipating surface, the blower fan may be disposed on the heat-absorbing surface, and the heat sink may be disposed on the heat-dissipating surface.

In another example, the secondary battery charging and discharging system according to the present invention includes a sensor configured to measure an internal temperature of the secondary battery charging and discharging system. In addition, the secondary battery charging and discharging system according to the present invention may further include a controller configured to receive the internal temperature of the secondary battery charging and discharging system measured by the sensor and to control the driving of the cooler.

In a specific example, the controller is configured to drive the cooler when the internal temperature of the secondary battery charging and discharging system measured by the sensor is higher than a reference temperature.

In still another example, the controller is configured to stop driving of the cooler when the internal temperature of the secondary battery charging and discharging system measured by the sensor unit is lower than the reference temperature.

Furthermore, the cooler may be provided as a plurality of coolers, which may be equidistantly arranged at an upper portion of the accommodation unit. In a specific example, the coolers may be located at an upper portion of the accommodation unit to blow the cooled air downward.

In still another example, the secondary battery charging and discharging system according to the present invention may further include n perforated plates (here, n is an integer greater than or equal to two) that are located in a blowing line of the cooler. The perforated plates may define a stacked structure.

In a specific example, each of the perforated plates has multiple holes, and the holes are located in a central region of the perforated plate.

In still another specific example, each of the perforated plates has multiple holes, and a size of the hole located in a central region of the perforated plate is greater than a size of the hole located in an edge region of the perforated plate.

Furthermore, the present invention provides a temperature control method of a secondary battery charging and discharging system using the secondary battery charging and discharging system described above.

In one example, the temperature control method of the secondary battery charging and discharging system according to the present invention includes charging and discharging a battery cell accommodated in the accommodation unit. In this case, the charging and discharging the battery cell includes measuring an internal temperature of the secondary battery charging and discharging system; and controlling, by a controller, the cooler according to the measured internal temperature of the secondary battery charging and discharging system.

In a specific example, controlling the cooler includes driving the cooler when the measured internal temperature of the secondary battery charging and discharging system is higher than a reference temperature.

In another example, the controlling the cooler includes stopping driving the cooler when the measured internal temperature of the secondary battery charging and discharging system is lower than the reference temperature.

Advantageous Effects

According to the secondary battery charging and discharging system including the Peltier element and the temperature control method of the secondary battery charging and discharging system using the same of the present invention, it is possible to increase the cooling efficiency of the secondary battery by applying the Peltier element to the blower fan of the cooling unit.

BRIEF DESCRIPTION OF THE DRAWINGS

FIG. 1 is a diagram showing a conventional secondary battery charging and discharging system.

FIG. 2 is a diagram schematically showing a cooling unit in a conventional secondary battery charging and discharging system.

FIG. 3 is a schematic diagram showing the principle of heat absorption or heat generation of a Peltier element.

FIG. 4 is a schematic diagram showing a secondary battery charging and discharging system according to an embodiment of the present invention.

FIGS. 5 and 6 are cross-sectional views schematically showing the cooling unit in the secondary battery charging and discharging system according to an embodiment of the present invention.

FIG. 7 is a block diagram showing a secondary battery charging and discharging system according to another embodiment of the present invention.

FIG. 8 is a flowchart showing a temperature control method of a secondary battery charging and discharging system according to an embodiment of the present invention.

BEST MODES

The present invention may be variously modified and have several forms, and specific embodiments will be shown in the accompanying drawings and described in detail below. However, this is not intended to limit the present invention to specific embodiments, and it should be understood that the present invention encompasses any modifications, equivalents and substitutes included in the spirit and scope of the present invention.

It will be understood that the terms "comprises," "comprising," "includes," and/or "including" used herein, specify the presence of stated features, integers, steps, operations, elements, components, or combinations thereof but do not preclude the presence or addition of one or more other features, integers, steps, operations, elements, components, and/or combinations thereof. Also, when an element such as a layer, film, region, or substrate is referred to as being "above" another element, it can be directly above the other element or intervening elements may also be present. Conversely, when an element such as a layer, film, region, or substrate is referred to as being "below" another element, it can be directly below the other element or intervening elements may also be present. In addition, the phrase "disposed on," used herein may include "disposed under" as well as "disposed above."

The present invention relates to a secondary battery charging and discharging system including a Peltier element and a temperature control method of a secondary battery charging and discharging system using the same.

A cooling unit of a conventional secondary battery charging and discharging system is used for dissipating heat from battery cells accommodated in a tray and therefore has limitations in effectively lowering the temperature inside the charging and discharging system.

Accordingly, the present invention provides a secondary battery charging and discharging system including a Peltier element and a temperature control method of a secondary battery charging and discharging system using the same. In particular, a cooling unit of the secondary battery charging and discharging system according to the present invention can increase the cooling efficiency of secondary batteries by including a Peltier element.

The secondary battery charging and discharging system including the Peltier element and the temperature control method of the secondary battery charging and discharging system using the same of the present invention will be described in detail below.

The cooling unit of the secondary battery charging and discharging system according to the present invention includes the Peltier element. The term "Peltier element" used herein refers to an element that uses heat absorption or heat generation due to the Peltier effect and has one side for absorbing heat and the other side for generating heat according to the direction of an electric current.

FIG. 3 is a schematic diagram showing the principle of heat absorption or heat generation of a Peltier element. The Peltier element included in the cooling unit will be described with reference to FIG. 3. The Peltier element, which is a thermoelectric element, consists of two or more semiconductors that are connected electrically in series and thermally in parallel and arranged such that heat only travels in one direction through a thermoelectric element while electricity continuously alternates above and below a substrate through N-type and P-type semiconductors. Heat is transferred from a heat-absorbing surface to a heat-dissipating surface through the thermoelectric element, and the transferred heat is proportional to a supplied voltage. At this time, by changing the polarity, it is possible to change the polarity of the current with the same thermoelectric element, and thus a change in function can be made between heating and cooling.

The cooling unit of the secondary battery charging and discharging system according to the present invention includes the Peltier element, and based on the Peltier element, a blower fan is disposed on one side, and the heat sink is disposed on the other side. In a specific example, when an electric current is applied to the Peltier element of the cooling unit, one side, where battery cells are placed, absorbs heat, and the other side generates heat. Meanwhile, a blower fan may be disposed on one side of the Peltier element to supply cooled air to the battery cells accommodated in an accommodation unit. The secondary battery charging and discharging system and the temperature control method of the secondary battery charging and discharging system using the same according to the present invention will be described in detail below.

In one example, the secondary battery charging and discharging system according to the present invention includes an accommodation unit configured to accommodate a battery cell, a charging and discharging unit electrically connected to first and second electrode leads of the battery cell accommodated in the accommodation unit, and a cooling unit configured to supply cooled air to the battery cell accommodated in the accommodation unit. In this case, the cooling unit includes a blower fan, a heat sink, and a Peltier element positioned between the blower fan and the heat sink.

The accommodation unit, which is for accommodating battery cells, may be in the form of a tray that accommodates multiple battery cells. The accommodation unit is described as a tray-shaped accommodation unit for accommodating multiple battery cells, but the present invention is not limited thereto. The accommodation unit is a substantially rectangular box-shaped member with an open upper portion, and the multiple battery cells are arranged therein and mounted in a matrix shape. In this case, the height of the accommodation unit may be formed to approximately correspond to the height of the battery cell.

In addition, the tray-shaped accommodation unit may have a structure in which both sides are perforated so that the first and second electrode leads of the accommodated battery cell can protrude. In a specific example, since both sides of the accommodation unit are perforated, the first and second electrode leads of the battery cells accommodated in the accommodation unit may have a structure that can be connected to the outside. For example, the first and second electrode leads of the battery cells accommodated in the accommodation unit may connected to the charging and discharging unit which will be described below.

In one example, the charging and discharging unit is located on both sides of the accommodation unit and is electrically connected to the first and second electrode leads of the multiple battery cells accommodated in the tray. The charging and discharging unit may activate the battery cell through charging and discharging caused through electrical connection to an electrode assembly of the battery cell. In this case, the charging and discharging unit is electrically connected to electrode leads of the battery cells through a charging and discharging line. The charging and discharging unit may supply charging power to the electric cell or receive discharging power from the electric cell. Here, the meaning of supplying the charging power to the secondary battery is not necessarily limited to the meaning of supplying sufficient power to fully charge the secondary battery. The meaning of supplying the charging power to the secondary battery may be used to mean supplying power that allows measuring the voltages of the first electrode lead, the second electrode lead, etc. for performance evaluation of the secondary battery. Since the meaning of receiving the discharging power from the secondary battery can be used in the same way, a repetitive description thereof will be omitted.

Meanwhile, the charging and discharging unit may be coupled to the multiple battery cells accommodated in the tray to supply power and charge and discharge the battery cells according to a charging time, a discharging time, a charging voltage, a discharging voltage, the number of charges, the number of discharges, etc.

In one example, the secondary battery charging and discharging system according to the present invention includes a cooling unit for cooling the battery cells accommodated in the accommodation unit. In a specific example, in the battery charging and discharging system, the efficiency or performance of the battery cell may be reduced, the durability of the battery cell may be reduced, and the thermal risk (e.g., partial burnout, explosion, etc.) of the battery cell may be increased when the temperature of the battery cell is, for example, 50° C. or higher while the battery cell is being charged and discharged. Accordingly, it is preferable to reduce the temperature of the battery using the cooling unit according to the present invention by dissipating heat generated during the charging and discharging process for the battery cell.

In a specific example, the cooling unit of the secondary battery charging and discharging system according to the present invention includes a blower fan, a heat sink, and a Peltier element positioned between the blower fan and the heat sink. The term "Peltier element" refers to an element that uses heat absorption or heat generation due to the Peltier effect and has one side for absorbing heat and the other side for generating heat according to the direction of an electric current. The Peltier element may have a structure including a heat-absorbing surface and a heat-dissipating surface, the blower fan is disposed on the heat-absorbing surface, and the heat sink is disposed on the heat-dissipating surface.

Specifically, when an electric current is applied to the Peltier element of the cooling unit, the heat-absorbing surface, where battery cells are placed, absorbs heat, and the heat-dissipating surface generates heat. In this case, a blower fan may be placed on one side of the Peltier element to supply or circulate the cooled air into the secondary battery charging and discharging system. In particular, by applying the Peltier element to the cooling unit, it is possible to increase the cooling efficiency of the secondary battery without an additional refrigerant.

Meanwhile, the secondary battery charging and discharging system may have a structure in which a hole is formed so that air heated inside can be discharged to the outside, and an additional blower fan may be further installed in the hole.

Furthermore, the heat sink may be disposed outside the space where the battery cells are accommodated. By forming a plurality of heat dissipating fins on the heat sink, it is possible to increase the dissipation efficiency of high temperature heat generated from the heat-dissipating surface of the Peltier element. In addition, a high thermal conductivity heat transfer member may be installed between the heat sink and the heat-dissipating surface of the Peltier element. In this case, since a thermal compound is used as the high thermal conductivity heat transfer member, it is possible to increase the thermal conductivity from the heat-dissipating surface to the heat sink.

In one example, the cooling unit generally includes a propeller-type blower fan which is widely used, and is located at an upper portion of the accommodation unit. Also, the cooling unit may be located at an upper portion of the accommodation unit to blow the cooled air downward. Furthermore, the secondary battery charging and discharging system according to the present invention may include multiple cooling units, which may be equidistantly arranged at an upper portion of the tray.

As another example, the secondary battery charging and discharging system according to the present invention may further include n perforated plates (here, n is an integer greater than or equal to two) that are located in the blowing line of the cooling unit and configured to form a stacked structure. In a specific example, n perforated plates, which will be described later, are installed in the blowing line of the cooling unit to blow air. As described above, the air blown downward may be introduced into the tray through an air flow path perforated in the perforated plates. The cooling unit may include a structure in which two to five perforated plates are stacked or a structure in which three to five perforated plates are stacked. For example, three perforated plates may be stacked.

In one example, n perforated plates serve to introduce the air blown by the cooling unit into the tray. For example, since the cooling unit includes three perforated plates, the air blown by the blower fan may pass through holes formed in the three perforated plates so that the flow rate can gradually become uniform.

In one example, the perforated plate has a structure in which multiple holes are formed as described above, and the holes are formed in a central region of the perforated plate. In particular, with this structure, by supplying a smaller amount of air to where a battery cell is accommodated in the outermost part of the tray compared to the conventional case, it is possible to balance the temperature deviation of the battery cells accommodated in the tray. Accordingly, it is possible to uniformly distribute the flow rate, thereby minimizing the temperature deviation between the multiple battery cells.

The shapes and sizes of the holes formed in the perforated plate are not limited, but the diameter of the hole formed in the central region of the perforated plate may be larger than the diameter of the hole formed in the edge region of the perforated plate. This is to reduce the amount of air supplied to the edge region when the multiple battery cells are accommodated in the accommodation unit.

In addition, the secondary battery charging and discharging system according to the present invention may include a sub air supply unit. As a specific example, the sub air supply unit blows cooled air from sides of the accommodation unit to the battery cell. The sub air supply unit may be oppositely installed on both sides of the tray such that air can be introduced in a direction parallel to the multiple battery cells.

As another example, the secondary battery charging and discharging system according to the present invention further includes a sensor unit configured to measure the internal temperature of the system and a control unit configured to receive the internal temperature of the secondary battery charging and discharging system measured by the sensor unit and control the driving of the cooling unit.

In a specific example, the sensor unit is provided as a temperature sensor for sensing the internal temperature of the secondary battery charging and discharging system. In the present invention, the internal temperature of the secondary battery charging and discharging system may be the temperature of the internal space of the secondary battery charging and discharging system or may refer to the temperature of the battery cell. For example, the internal temperature of the secondary battery charging and discharging system may refer to the temperature of the battery cell in the charging and discharging process. As described above, when the temperature of the battery cell becomes too high while the battery cell is being charged and discharged, the efficiency or performance of the battery cell may be reduced, and the durability of the battery cell may be reduced. To prevent this, the temperature sensor may monitor the internal temperature of the secondary battery charging and discharging system in real time and deliver the internal temperature to the control unit, and the control unit may control whether to drive the cooling unit.

Meanwhile, when multiple battery cells are accommodated in the accommodation unit, the temperature sensor may include multiple temperature sensors. Furthermore, the sensor unit may be a non-contact temperature sensor capable of sensing the surface temperature of the battery cell.

The control unit performs control so that the cooling unit may be driven when the internal temperature of the secondary battery charging and discharging system is higher than a reference temperature. In addition, the control unit performs control so that the driving of the cooling unit may be stopped when the internal temperature of the secondary battery charging and discharging system is lower than a reference temperature. As described above, the internal temperature of the secondary battery charging and discharging system may refer to the temperature of the battery cell accommodated in the accommodation unit.

For example, the control unit may set the reference temperature to 50° C. The control unit drives the cooling unit when the temperature of the battery cell is higher than 50° C. and stops the driving of the cooling unit when the temperature of the battery cell is lower than 50° C. Thus, by driving the cooling unit according to the temperature of the battery cell of the secondary battery charging and discharging system, it is possible to more efficiently maintain the temperature.

Furthermore, the present invention provides a temperature control method of a secondary battery charging and discharging system using the secondary battery charging and discharging system.

In one example, the temperature control method of the secondary battery charging and discharging system according to the present invention includes an operation of charging and discharging a battery cell accommodated in an accommodation unit. In this case, the operation of charging and discharging the battery cell includes operations of measuring the internal temperature of the secondary battery charging and discharging system and controlling whether to drive a cooling unit according to the measured internal temperature of the secondary battery charging and discharging system.

As described above, a sensor unit measures the internal temperature of the secondary battery charging and discharging system. Also, a control unit controls the driving of the cooling unit on the basis of the internal temperature of the secondary battery charging and discharging system measured by the sensor unit. That is, the control unit drives the cooling unit when the internal temperature of the secondary battery charging and discharging system is higher than a reference temperature and stops the driving of the cooling unit when the internal temperature of the secondary battery charging and discharging system is lower than a reference temperature.

Meanwhile, the internal temperature of the secondary battery charging and discharging system may be the temperature of the internal space of the secondary battery charging and discharging system or may refer to the temperature of the battery cell. For example, the internal temperature of the secondary battery charging and discharging system may refer to the temperature of the battery cell in the charging and discharging process.

With the temperature control method of the secondary battery charging and discharging system according to the present invention, by applying the Peltier element to the cooling unit, it is possible to increase the cooling efficiency of the secondary battery in the charging and discharging process.

MODES FOR CARRYING OUT THE INVENTION

Hereinafter, the present invention will be described in detail with reference to the accompanying drawings. However, the configurations shown in the drawings of the present specification are just embodiments of the present invention and do not represent all the technical spirit of the present invention. Therefore, it should be understood that there may be various equivalents and modifications which can replace the configurations.

First Embodiment

FIG. 4 is a schematic diagram showing a secondary battery charging and discharging system according to an embodiment of the present invention. Referring to FIG. 4, a secondary battery charging and discharging system 100 according to the present invention is configured to include an accommodation unit 110 configured to accommodate a battery cell 1, a charging and discharging unit 120 electrically connected to first and second electrode leads of the battery cell 1 accommodated in the accommodation unit 110, and a cooling unit 130 configured to supply cooled air to the battery cell 1 accommodated in the accommodation unit 110.

The accommodation unit 110 is for accommodating the battery cell 1 and is in the form of a tray for accommodating multiple battery cells 1. In detail, the accommodation unit 110, which is a substantially rectangular box-shaped member with an open upper portion, has the multiple battery cells 1 arranged in a matrix form. In this case, the height of the accommodation unit 110 is formed to approximately correspond to the height of the battery cell 1. In addition, the accommodation unit 110 is a structure in which both sides are perforated so that the first and second electrode leads of the accommodated battery cell 1 can protrude. Specifically, since both sides of the accommodation unit 110 are perforated, the first and second electrode leads of the battery cell 1 accommodated in the accommodation unit 110 can be connected to the outside. For example, the first and second electrode leads of the battery cell 1 accommodated in the accommodation unit 110 are electrically connected to the charging and discharging unit 120, which will be described below.

In addition, the charging and discharging unit 120 is located on both sides of the accommodation unit 110 and is electrically connected to the first and second electrode leads of the multiple battery cells 1 accommodated in the accommodation unit 110. Specifically, the charging and discharging unit 120 may be coupled to the multiple battery cells 1 accommodated in the accommodation unit 110 to supply power and charge and discharge the battery cells 1 according to a charging time, a discharging time, a charging voltage, a discharging voltage, the number of charges, the number of discharges, etc.

The cooling unit 130, which is for cooling the battery cell 1 accommodated in the accommodation unit 110, supplies cooled air to the battery cell 1. Meanwhile, in the secondary battery charging and discharging system 100 according to the present invention, the cooling unit 130 includes a blower fan 131, a heat sink 132, and a Peltier element 133 positioned between the blower fan 131 and the heat sink 132. Specifically, the Peltier element 133 refers to an element that uses heat absorption or heat generation due to the Peltier effect and that has one side for absorbing heat and the other side for generating heat according to the direction of an electric current.

In the secondary battery charging and discharging system 100 according to the present invention, the Peltier element 133 has a structure including a heat-absorbing surface and a heat-dissipating surface. In this structure, the blower fan 131 is disposed on the heat-absorbing surface, and the heat sink 132 is disposed on the heat-dissipating surface. Specifically, when an electric current is applied to the Peltier element 133 of the cooling unit 130, the heat-absorbing surface, where the battery cells 1 are placed, absorbs heat, and the heat-dissipating surface generates heat. In this case, the blower fan 131 may be disposed on one side of the Peltier element 133 to supply cooled air to the battery cells accommodated in the accommodation unit 110.

Meanwhile, the heat sink 132 is disposed outside the space where the battery cells 1 are accommodated. By forming a plurality of heat dissipating fins 1321 on the heat sink 132, it is possible to increase the dissipation efficiency of high temperature heat generated from the heat-dissipating surface of the Peltier element 133.

With such a configuration, the cooling unit of the secondary battery charging and discharging system according to the present invention can increase the cooling efficiency of secondary batteries in the charging and discharging process by including a Peltier element.

FIGS. 5 and 6 are cross-sectional views schematically showing the cooling unit in the secondary battery charging and discharging system according to an embodiment of the present invention. Referring to FIG. 5, three perforated plates 141, 142, and 143 are stacked along a flow path of the cooling unit 130. Each of the perforated plates 141, 142, and 143 is a structure in which through-holes 1411 are formed in the thickness direction. The holes 1411 are formed in central regions of the perforated plates 141, 142, and 143.

In another example, referring to FIG. 6, three perforated plates 141, 142, and 143 are stacked along the flow path of the cooling unit 130. Each of the perforated plates 141, 142, and 143 is a structure in which through-holes 1412 and 1413 are formed in the thickness direction. The diameter of the hole 1412 formed in the central region of each of the perforated plates 141, 142, and 143 is larger than the diameter of the hole 1413 formed in the edge region of each of the perforated plates 141, 142, and 143.

Second Embodiment

FIG. 7 is a block diagram showing a secondary battery charging and discharging system according to another embodiment of the present invention. Referring to FIG. 7, a secondary battery charging and discharging system 200 according to the present invention further includes a sensor unit 240 configured to measure the internal temperature of the system 200 and a control unit 250 configured to receive the internal temperature of the secondary battery charging and discharging system 200 measured by the sensor unit 240 and control the driving of a cooling unit 230.

The sensor unit 240 is provided as a temperature sensor for sensing the internal temperature of the secondary battery charging and discharging system 200. The temperature sensor monitors the internal temperature of the secondary battery charging and discharging system 200 in real time and delivers the internal temperature to the control unit 250.

The sensor unit 240 is provided as a temperature sensor, and the control unit 250 receives the internal temperature information of the secondary battery charging and discharging system 200 from the sensor unit 240. The control unit 250 performs control so that the cooling unit 230 is driven when the internal temperature of the secondary battery charging and discharging system 200 is higher than a reference temperature. In addition, the control unit 250 performs control so that the driving of the cooling unit 230 is stopped when the internal temperature of the secondary battery charging and discharging system 200 is lower than a reference temperature. Here, the internal temperature of the secondary battery charging and discharging system 200 refers to the temperature of the battery cell accommodated in an accommodation unit 210.

For example, the control unit 250 may set the reference temperature to 50° C. In the charging and discharging process, the control unit 250 drives the cooling unit 230 when the temperature of the battery cell is higher than 50° C. and stops the driving of the cooling unit 230 when the temperature of the battery cell is lower than 50° C. Accordingly, since the cooling unit 230 is driven according to the temperature of the battery cell in the charging and discharging process, it is possible to more efficiently maintain the temperature.

Third Embodiment

The present invention provides a temperature control method of a secondary battery charging and discharging system using the secondary battery charging and discharging system.

FIG. 8 is a flowchart showing a temperature control method of a secondary battery charging and discharging system according to an embodiment of the present invention. Referring to FIG. 8, the temperature control method of the secondary battery charging and discharging system according to the present invention includes an operation of charging and discharging a battery cell accommodated in an accommodation unit. The operation of charging and discharging the battery cell includes operations of measuring the internal temperature of the secondary battery charging and discharging system and controlling whether to drive the cooling unit according to the measured internal temperature of the secondary battery charging and discharging system.

As described above, a sensor unit measures the internal temperature of the secondary battery charging and discharging system. Also, the driving of the cooling unit is controlled based on the internal temperature of the secondary battery charging and discharging system measured by the sensor unit. That is, the cooling unit is driven when the internal temperature of the secondary battery charging and discharging system is higher than the reference temperature, and the driving of the cooling unit is stopped when the internal temperature of the secondary battery charging and discharging system is lower than the reference temperature.

Here, the internal temperature of the secondary battery charging and discharging system refers to the temperature of the battery cell accommodated in the accommodation unit.

For example, the reference temperature may be set to 50° C. In the charging and discharging process, the cooling unit is driven when the temperature of the battery cell is higher than 50° C., and the driving of the cooling unit is stopped when the temperature of the battery cell is lower than 50° C. Accordingly, since the cooling unit is driven according to the temperature of the battery cell in the charging and discharging process, it is possible to more efficiently maintain the temperature.

With the temperature control method of the secondary battery charging and discharging system according to the present invention, by applying the Peltier element to the cooling unit, it is possible to increase the cooling efficiency of secondary batteries in the charging and discharging process.

While the preferred embodiments of the present invention have been described with reference to the accompanying drawings, it will be understood by those skilled in the art that variations and modifications of the invention may be made without departing from the spirit and scope of the invention as defined by the appended claims.

Therefore, the technical scope of the present invention should not be limited to the contents described in the detailed description of the specification, but should be determined by the claims.

The invention claimed is:

1. A secondary battery charging and discharging system comprising:

an accommodation unit configured to accommodate a battery cell;

a charging and discharging unit configured to be electrically connected to and from first and second electrode leads of the battery cell accommodated in the accommodation unit;

a cooler configured to supply cooled air to the battery cell accommodated in the accommodation unit, the cooler including:

a blower fan;

a heat sink; and a Peltier element positioned between the blower fan and the heat sink; and n perforated plates positioned in a blowing line of the cooler, where n is an integer greater than equal to two, and the perforated plates define a stacked structure, wherein each of the perforated plates has multiple holes, and wherein a size of the hole located in a central region of the perforated plate is greater than a size of the hole located in an edge region of the perforated plate.

2. The secondary battery charging and discharging system of claim 1, wherein the Peltier element has a structure including a heat-absorbing surface and a heat-dissipating surface, wherein the blower fan is disposed on the heat-absorbing surface, and wherein the heat sink is disposed on the heat-dissipating surface.

3. The secondary battery charging and discharging system of claim 1, further comprising a sensor configured to measure an internal temperature of the secondary battery charging and discharging system.

4. The secondary battery charging and discharging system of claim 3, further comprising a controller configured to:

receive the internal temperature of the secondary battery charging and discharging system measured by the sensor; and control the driving of the cooler.

5. The secondary battery charging and discharging system of claim 4, wherein the controller is configured to drive the cooler when the internal temperature of the secondary battery charging and discharging system measured by the sensor is higher than a reference temperature.

6. The secondary battery charging and discharging system of claim 5, wherein the controller is configured to stop driving of the cooler when the internal temperature of the secondary battery charging and discharging system measured by the sensor is lower than the reference temperature.

7. The secondary battery charging and discharging system of claim 1, wherein the cooler is provided as a plurality of coolers, and the plurality of coolers are equidistantly arranged at an upper portion of the accommodation unit.

8. The secondary battery charging and discharging system of claim 1, wherein the cooler is positioned at an upper portion of the accommodation unit to blow cooled air downward.

9. The secondary battery charging and discharging system of claim 1, wherein each of the perforated plates has multiple holes, and the holes are located in central regions of the perforated plates.

10. A temperature control method of a secondary battery charging and discharging system using the secondary battery charging and discharging system of claim 1.

11. The temperature control method of claim 10, further comprising charging and discharging a battery cell accommodated in the accommodation unit, wherein the charging and discharging of the battery cell comprises:

measuring an internal temperature of the secondary battery charging and discharging system; and controlling, by a controller, the cooler according to the measured internal temperature of the secondary battery charging and discharging system.

12. The temperature control method of claim 11, wherein controlling the cooler includes driving the cooler when the measured internal temperature of the secondary battery charging and discharging system is higher than a reference temperature.

13. The temperature control method of claim 12, wherein controlling the cooler includes stopping driving the cooler when the measured internal temperature of the secondary battery charging and discharging system is lower than the reference temperature.

* * * * *